(12) United States Patent
Fiebig

(10) Patent No.: US 10,750,165 B2
(45) Date of Patent: Aug. 18, 2020

(54) OBJECT SIMULATION UNIT FOR TESTING A CAMERA OBJECTIVE AND DIAGNOSTIC SYSTEM

(71) Applicant: Arnold & Richter Cine Technik GmbH & Co. Betriebs KG, Munich (DE)

(72) Inventor: Susanne Fiebig, Ottobrunn (DE)

(73) Assignee: Arnold & Richter Cine Technik GmbH & Co. Betriebs KG, Munich (DE)

( * ) Notice: Subject to any disclaimer, the term of this patent is extended or adjusted under 35 U.S.C. 154(b) by 32 days.

(21) Appl. No.: 15/661,998

(22) Filed: Jul. 27, 2017

(65) Prior Publication Data
US 2018/0035109 A1    Feb. 1, 2018

(30) Foreign Application Priority Data

Jul. 27, 2016 (DE) .................. 10 2016 113 887

(51) Int. Cl.
*H04N 17/00* (2006.01)
*G03B 17/12* (2006.01)
(Continued)

(52) U.S. Cl.
CPC ........... *H04N 17/002* (2013.01); *G02B 27/62* (2013.01); *G03B 17/12* (2013.01); *G03B 43/00* (2013.01);
(Continued)

(58) Field of Classification Search
CPC .................................................. H04N 17/002
(Continued)

(56) References Cited

U.S. PATENT DOCUMENTS 8,342,710 B2   1/2013 Rahbar-Dehghan
9,268,202 B1   2/2016 Dey
(Continued)

FOREIGN PATENT DOCUMENTS

DE        698 20 363 T2     2/2005
DE    10 2011 076 133 A1   11/2012
(Continued)

OTHER PUBLICATIONS

European Search Report of EP 17182818 dated Dec. 11, 2017.

*Primary Examiner* — Jefferey F Harold
*Assistant Examiner* — Justin B. Sanders
(74) *Attorney, Agent, or Firm* — Amster, Rothstein & Ebenstein LLP

(57) ABSTRACT

An object simulation unit for testing a camera objective has an optical axis and has a front side with respect to the optical axis at one side. The object simulation unit comprises a light exit surface at the front side of the object simulation unit, a coupling device that is adapted to couple the front side of the objection simulation unit to a light entry side of a camera objective, and a light beam generation device that has at least one light source and that is adapted to generate at least one light beam that passes through the light exit surface such that the at least one light beam apparently starts from a virtual object located at a distance from the light exit surface that is larger than the distance between the light beam generation device and the light exit surface. A diagnostic system may comprise such an object simulation unit.

43 Claims, 3 Drawing Sheets

Figure 1:
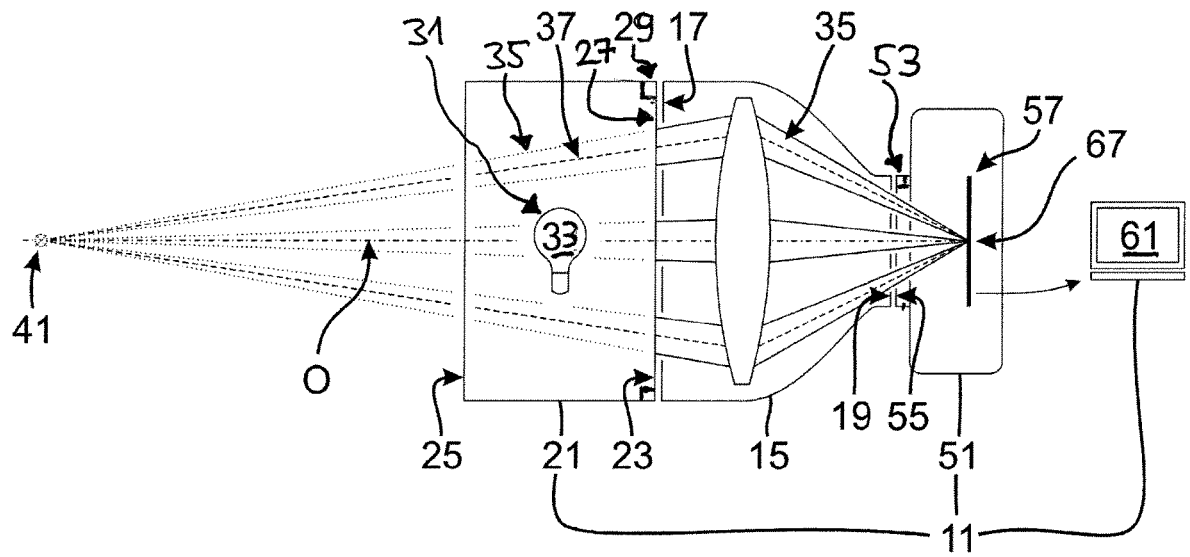

(51) Int. Cl.
  *G03B 43/00* (2006.01)
  *G02B 27/62* (2006.01)
  *G06F 30/20* (2020.01)
  *H04N 5/232* (2006.01)
  *H04N 17/02* (2006.01)

(52) U.S. Cl.
  CPC ......... *G06F 30/20* (2020.01); *H04N 5/23212* (2013.01); *H04N 17/02* (2013.01)

(58) Field of Classification Search
  USPC ....................................................... 348/187
  See application file for complete search history.

(56) References Cited

U.S. PATENT DOCUMENTS

| | | | |
|---|---|---|---|
| 2013/0038719 A1* | 2/2013 | Canini | G06K 7/10732 |
| | | | 348/135 |
| 2016/0012269 A1* | 1/2016 | Kowalczyk | G06K 7/10831 |
| | | | 235/462.21 |
| 2016/0134796 A1* | 5/2016 | Kaneko | G02B 7/02 |
| | | | 348/208.11 |
| 2016/0364015 A1* | 12/2016 | Send | G01S 17/32 |

FOREIGN PATENT DOCUMENTS

| | | |
|---|---|---|
| DE | 102011076133 A1 | 11/2012 |
| DE | 102011078631 A1 | 1/2013 |
| DE | 10 2012 200 152 A1 | 7/2013 |
| JP | 2005016981 A | 1/2005 |
| JP | 2007 298 672 A | 11/2007 |
| WO | 2008/039309 A2 | 4/2008 |
| WO | 2013102555 A1 | 7/2013 |

\* cited by examiner

OBJECT SIMULATION UNIT FOR TESTING A CAMERA OBJECTIVE AND DIAGNOSTIC SYSTEM

The present invention relates to an object simulation unit for testing a camera objective, wherein the object simulation unit has an optical axis and a front side with respect to the optical axis at one end. The object simulation unit has a light exit surface and a coupling device at its front side and the coupling deice is adapted to couple the front side of the object simulation unit to a light entry side of a camera objective. A light beam generation device is furthermore provided. The present invention furthermore relates to a diagnostic system having such an object simulation unit.

Cameras, in particular digital still cameras or digital video cameras, are frequently configured for operation with interchangeable objectives. In this case, the camera has an image sensor and an objective mount for connecting an objective (i.e. a lens assembly in a separate housing), with the image sensor and the objective being arranged along an optical axis of the camera.

The objective mount defines a support plane for the objective to be connected. The light sensitive surface of the image sensor defines a sensor plane. As a rule, the support plane and the sensor place correspond to a respective orthogonal plane with respect to the optical axis of the camera. The distance between the support plane and the sensor plane forms the so-called flange focal length of the camera. A flange focal length is correspondingly also defined for the camera objective. Since the optical design of a respective objective is calculated toward a specific position of the sensor with respect to the optical elements of the objective, the optical spacing between the support plane and the image sensor as well as the flange focal length resulting from the spacing of the optical elements from the support plane have to coincide. Otherwise differences result between a set distance value in accordance with a distance scale of the objective and the actual distance of the object to be imaged.

A manually operated or power operated focusing mechanism, in particular a rotatable objective ring or focus ring, that is provided with a distance scale is namely frequently provided to set the image definition. So that an object which is located at a distance which corresponds to the set distance value on the distance scale is also actually imaged in focus, it is therefore necessary for the actual flange focal length to correspond to the flange focal length for which the respective objective was designed.

The actual flange focal length can depend on various underlying conditions in the operation of the camera so that at times differences between the set distance value in accordance with the distance scale of the objective and the actual distance of the object to be imaged occur and/or no ideal focusing takes place. There is also in particular a possible error source in that the flange focal length of the camera and the flange focal length of the objective can be checked and set separately.

A test projector that projects a test slide in a reverse optical path from behind through the objective onto a projection surface can be used for a check of the distance scale or of the flange focal length. Differences between the set distance and the actual distance or the flange focal length can be determined by a spacing change between the projector and the projection surface or by an adjustment of the focal length at the objective to be checked. Such test projectors, however, only offer a limited distance measurement range. In addition only the flange focal length of the objective is tested, but not the flange focal length of the camera. The latter therefore has to be measured separately, which represents a substantial error source.

There are furthermore various units based on collimators for measuring the flange focal length of objectives. They can, however, only test an objective focused to "infinity". In addition, the flange focal length of the camera must also be measured separately here.

The flange focal length or a difference of the focal position can also be determined with the aid of a unit for measuring the objective contrast called an MTF (modulation transfer function) unit. Such MTF units are, however, frequently very large, expensive and complex units with corresponding demands on the environment, the operation and the maintenance. The flange focal length of the camera again has to be measured separately from the flange focal length of the objective.

It is therefore the object of the invention to provide an object simulation unit and a diagnostic system with the aid of which the flange focal length or the foal position of a camera objective and/or of an objective-camera system can be determined simply and inexpensively.

The object is satisfied by an object simulation unit having the features of claim 1.

The object simulation unit comprises a light exit surface at the front side of the object simulation unit, a coupling device that is adapted to couple the front side of the objection simulation unit to a light entry side of a camera objective, and a light beam generation device that has at least one light source and that is adapted to generate at least one light beam that passes through the light exit surface such that the at least one light beam apparently starts from one or more virtual objects located at a distance from the light exit surface that is larger than the distance between the light beam generation device and the light exit surface.

The at least one virtual object can in particular be located at a distance from the light exit surface that is larger than the distance between the light source of the light beam generation device and the light exit surface. The respective virtual light source or the respective virtual object can in particular (apparently) be arranged outside the object simulation unit, i.e. at the other side of a rear side of the object simulation unit. The light beam generation device can nevertheless be provided close to the front lens of the objective to be checked so that the object simulation unit can have a very compact design.

The light exit surface of the object simulation unit can comprise one or more light exit windows. The light exit surface can in particular extend perpendicular to the optical axis of the object simulation unit. The named coupling device can peripherally surround the light exit surface and can, for example, comprise a bayonet fastening, a screw connector or a clamp connector. The named distance between the virtual object and the light exit surface can in particular be larger than the extent of the object simulation unit along the optical axis. The object simulation unit can thereby in particular allow the check of distance values that are substantially larger than the dimensions of the object simulation unit.

In the object simulation unit, a respective light beam can pass through the light exit surface at a lateral exit distance from the optical axis and along a light exit axis that is inclined by an exit angle with respect to the optical axis, with the exit spacing and the exit angle differing from zero and with the exit spacing and the exit angle (geometrically) corresponding to a virtual light source. This virtual light source is located at a greater distance than the actual light source, in particular outside the object simulation unit, i.e. at the other side of a rear side of the object simulation unit. A light beam is here not necessarily understood as a beam of parallel light beams or only as a light beam bounded on a line, but can rather in particular comprise a divergent beam.

In accordance with an advantageous embodiment, the virtual object at least substantially corresponds to a virtual point light source. The evaluation whether the camera objective is focused on the virtual object is hereby simplified since, for example, only the diameter of one or more images of the virtual object generated on the sensor has to be examined for this purpose, for example, wherein the image or images should be of point shape on an exact focusing or should have a minimal diameter.

Alternatively to this, the virtual object can correspond to a linear virtual light source that extends within an orthogonal plane with respect to the optical axis. A straight-line virtual light source can in particular be provided.

It is furthermore also possible that the virtual object corresponds to a two-dimensional light source, i.e. to an areal virtual light source that extends within the orthogonal plane with respect to the optical axis of the object simulation unit.

The evaluation whether the camera objective is focused on the virtual object can take place, for example, on the basis of an edge blur of the virtual object.

In accordance with a further embodiment, the light beam generation device can be adapted to generate or to simulate a respective virtual object on the optical axis at different distances from the light exit surface of the object simulation unit after one another in time, that is at different positions along the optical axis. Alternatively or additionally, the light beam generation device can be adapted to simultaneously generate a plurality of virtual objects within a common orthogonal plane with respect to the optical axis. The light beam generation device can furthermore be adapted to simultaneously generate a plurality of virtual objects at a different lateral spacing from the optical axis.

With the object simulation unit, the distance between the respective virtual object exit and the light exit surface of the object simulation unit can therefore be settable. The setting of the distance can in particular take place by a corresponding adjustment of the light beam generation device or of a part thereof. A pivoting of light sources and/or of associated imaging elements can be provided, for example. The setting of different distances preferably takes place after one another so that a separate diagnosis of a coupled camera objective or of a coupled objective-camera system can be carried out for each set distance of the virtual object.

Provision can be made to set different distances of the respective virtual object that the at least one light beam passes through the light exit surface of the object simulation unit along a light exit axis that is inclined by an exit angle with respect to the optical axis, with the exit angle being settable.

Provision can be made in accordance with a further embodiment that the lateral spacing of the at least one virtual object from the optical axis of the object simulation unit is settable.

In a corresponding manner, if a plurality of light beams pass through the light exit surface of the object simulation unit, the exit angles of the plurality of light beams and/or the respective lateral exit spacing of the plurality of light beams can be settable.

The object simulation unit device in accordance with an advantageous embodiment can have an electrically controllable drive for the setting of different distances of the respective virtual object, for example by adjusting the position and/or the orientation of a respective light source and/or of a respective imaging element.

Provision can be made that the light beam generation device only generates a single light beam.

It has, however, proved advantageous if the light beam generation device is adapted to generate a plurality of light beams that pass through the light exit surface of the object simulation unit. The plurality of light beams can in particular pass through the light exit surface along a respective light exit axis. The angular orientations of the light exit axes of some or all of the plurality of light beams can be different. The light exit axes of the plurality of light beams can in particular be oriented such that the plurality of light beams appear to start from the at least one virtual object, i.e. from the one or from the plurality of virtual objects. As will be explained in the following, a plurality of virtual objects can be provided, for example, with a respective light beam apparently starting from a respective one of the plurality of virtual objects. Or provision can be made that all of the plurality of light beams apparently start from the same virtual object. Or provision can also be made that a respective plurality of light beams apparently start from a plurality of virtual objects.

The plurality of light beams can in particular pass through the light exit surface of the object simulation unit at a respective exit spacing from the optical axis and along a respective light exit axis that is inclined by a respective exit angle with respect to the optical axis, with the exit spacings and the exit angles of the plurality of light beams defining the position of the at least one virtual object.

The light exit axes of the plurality of light beams can in particular be oriented such that the light beams appear to start from one or more virtual objects, with the respective position of the virtual object or of the virtual objects being formed by the points of intersection of the extensions of the light beams imagined from the light exit surface in the direction of the object simulation unit.

In this embodiment, a plurality of light beams are therefore accordingly provided that are generated by one or more light sources. The light beam generation device can generate the plurality of light beams simultaneously or after one another, e.g. to simulate different distances of the virtual object or different image heights at the same distance. The light exit axes can extend in different directions.

In accordance with an embodiment, the light exit axes of the plurality of light beams are oriented such that the plurality of light beams appear to start from a single virtual object. This single virtual object preferably lies on the optical axis of the object simulation unit.

Alternatively to this, it is also possible that the plurality of light beams pass through the light exit surface of the object simulation unit along a respective light exit axis, with the light exit axes being oriented such that the plurality of light beams appear to start from different virtual objects. A plurality of virtual objects can hereby be generated. In this respect—in particular when a plurality of virtual objects are generated simultaneously—at least some of the plurality of virtual objects can be distributed in the peripheral direction within the same orthogonal plane with respect to the optical axis and/or with respect to the optical axis and/or can be arranged at a different lateral spacing from the optical axis. Alternatively—in particular when a plurality of virtual objects are generated after one another in time—at least some of the plurality of virtual objects can be arranged at different distances from the light exit surface of the object simulation unit.

In accordance with a further embodiment, at least some of the plurality of light beams are arranged distributed in the peripheral direction with respect to the optical axis.

Alternatively or additionally, at least some of the plurality of light beams can pass through the light exit surface at a different lateral exit spacing from the optical axis.

In accordance with another advantageous embodiment, the plurality of light beams are separate from one another. The separate light beams are preferably spaced apart from one another. The evaluation whether the camera objective is focused on the virtual object is thereby simplified since all the light beams are only combined in a light spot in the focus in an image generated by the camera objective of a, for example, point-shaped virtual object. Otherwise a plurality of mutually spaced apart or at least distinguishable light spots exist with a defocused objective.

Alternatively to this, the plurality of light beams can together form a uniform beam. It is to be understood by this that the plurality of light beams can merge into one another continuously or distinguishably, for example in the form of a cone.

A particular advantage of the embodiment having a plurality of light beams is that they do not necessarily have to fill the total entrance pupil of the camera objective. But it is rather generally sufficient if the light beams only fill a part of the objective diaphragm, with a focal position hereby being simulated equivalent to the focal position of a completely filled objective diaphragm. For example, the light beams can be generated or can pass through the light exit surface of the object simulation unit such that they are only arranged in a radially limited region (e.g. close to the axis) and/or spaced apart from one another in the peripheral direction in the camera objective with respect to the optical axis of the camera objective.

In accordance with an embodiment, the light beam generation device can, however, also be adapted to generate a plurality of light beams that pass through the light exit surface of the object simulation unit at exit points that are at least substantially distributed over the total light exit surface. The light beams can hereby at least substantially completely fill an entrance pupil of the camera objective so that optical paths both close to and remote from the axis and optical paths in a plurality of peripheral angular ranges are considered for the diagnosis of the flange focal length with respect to the optical axis of the camera objective.

In accordance with a further embodiment, the light beam generation device can have at least one imaging element that is associated with the at least one light source. The respective imaging element can be of a refractive, reflective or diffractive kind. The respective imaging element can—viewed from the light exit surface in the direction of the light source—in particular be arranged behind the light exit surface of the object simulation unit or the respective imaging element can be formed by the light exit surface. The at least one light source is preferably arranged behind the imaging element—viewed from the light exit surface—on a use of a refractive or diffractive imaging element (e.g. a lens) and in front of the imaging element up to the focal plane of the reflective imaging element on a use of a reflective imaging element (e.g. a concave mirror).

A common imaging element can be associated with at least some of a plurality of light beams and/or of a plurality of light sources. Alternatively, a plurality of imaging elements can be provided, with a separate imaging element (i.e. a different imaging element) being able to be associated with every single one of a plurality of light beams and/or with every single one of a plurality of light sources.

In an advantageous embodiment of the invention, the light beam generation device comprises a plurality of light sources.

In accordance with an embodiment, the light beam generation device can be adapted to generate a plurality of light beams that pass through the light exit surface of the object simulation unit, with each of the plurality of light sources generating at least one of the plurality of light beams (i.e. exactly one or some of the plurality of light beams). It is also possible that each of the plurality of light sources generates a single one of the plurality of light beams (i.e. each of the plurality of light sources generates a different one of the plurality of light beams).

It has been found to be advantageous in this connection if the plurality of light sources are arranged within the same orthogonal plane with respect to the optical axis (i.e. within a common plane that is perpendicular to the optical axis of the object simulation unit). Alternatively, a plurality of light sources can be arranged at difference distances from the light exit surface.

In accordance with an embodiment, at least some of the plurality of light sources can be arranged distributed in the peripheral direction with respect to the optical axis.

Alternatively or additionally, at least some of the plurality of light sources can be arranged at different spacings from the optical axis.

The light beams of the plurality of light sources can pass through the light exit surface of the object simulation unit along a respective light exit axis, with the position of the virtual object in particular being able to be fixed by the orientations of the light exit axes.

In accordance with a further advantageous embodiment of the invention, the position and/or the orientation of the plurality of light sources can be adjusted such that the distance between the virtual object and the light exit surface of the object simulation unit is variable by an adjustment of the plurality of light sources.

The light beam generation device can furthermore have a plurality of imaging elements in accordance with an advantageous embodiment, with at least one of the plurality of imaging elements being associated with each of the plurality of light sources. Exactly one of the plurality of imaging elements can in particular be associated with each of the plurality of light sources.

The position and/or the orientation of the plurality of imaging elements can advantageously be adjusted such that the distance between the virtual object and the light exit surface of the object simulation unit is variable by an adjustment of the plurality of imaging elements. The plurality of imaging elements can in particular be adjustable such that the angle of the already named light exit axes hereby changes with respect to the optical axis of the object simulation unit. Provision can be made that the imaging elements are adjustable independently of the respective light source. Provision can alternatively be made that each of the plurality of imaging elements is adjustable together with the respective light source. It is furthermore possible that some or all of the plurality of imaging elements are adjustable together, in particular by means of a common drive device.

The adjustment can take place in different manners (alternatively to one another or also in combination). A pivoting of the light sources, in particular together, can thus, for example, be provided with a respective imaging element, with a laser or another light source having a fixedly associated lens being able to be provided as the light source, for example. The light sources, in particular together with a respective associated imaging element, i.e. as a unit of light source and optics, can furthermore be offset laterally to the optical axis, in particular perpendicular thereto. The adjustment of the light sources and/or of the imaging elements can furthermore also comprise a combination of pivoting and displacing.

An adjustment for changing the distance can furthermore also comprise either only the light sources or only the imaging elements being pivoted and/or being displaced laterally to the optical axis and/or in the direction of the optical axis. In accordance with another embodiment of the invention, the light beam generation device has only one single light source.

It has proved advantageous in this connection if the light source is adapted to emit a divergent light cone, with the light beam generation device being adapted to generate a plurality of light beams that pass through the light exit surface of the object simulation unit from the divergent light cone. This plurality of light beams can advantageously be spaced apart from one another.

In accordance with an embodiment, the light beam generation device has an imaging element associated with the single light source. This one imaging element can—as explained above—have refractive, diffractive or reflective properties. The imaging element can in particular be formed as a lens (e.g. a converging lens, a diverging lens, a Fresnel lens) or as a concave mirror.

In accordance with yet a further advantageous embodiment, the light beam generation device (having one or more light sources) can comprise at least one diaphragm apparatus, with the diaphragm apparatus being able to have one or more diaphragm aperture(s) variable with respect to their opening width(s) and/or position(s) which transmit portions of the light emitted by the at least one light source.

In accordance with a further advantageous embodiment, the at least one light source can emit white light such that the at least one light beam comprises white light or consists of white light. The diagnosis of a coupled camera objective can hereby take place inherently over a wavelength range that at least substantially comprises the total visible spectrum.

The light beam generation device can, however, also be adapted to generate the at least one light beam with one of a plurality of different selectable colors. In other words, in this embodiment, one of a plurality of colors, i.e. one of a plurality of bounded wavelength ranges within the visible spectrum, can be selected, with the diagnosis of a coupled camera objective only taking place for this color (e.g. red). A further diagnosis can then be carried out for one or more other colors (e.g. green or blue). A wavelength-dependent diagnosis of the camera objective can thus take place, in particular for determining wavelength-dependent correction values, for examining color defects of the camera objective and/or for avoiding chromatic aberrations in the generation of the virtual object.

In accordance with an embodiment, the at least one light source can settably emit both white light and colored light, in particular in a respective one of the colors red, green and blue.

The present invention furthermore relates to a diagnostic system having an object simulation unit in accordance with one of the above-explained embodiments and having an evaluation device that is configured to determine a degree of focus of an image of the at least one virtual object that is generated by the respective camera object coupled to the object simulation unit. Provided therefore a camera objective to be tested is coupled to the object simulation unit, the camera objective can generate an image of the virtual object simulated by means of the object simulation unit and the evaluation device evaluates the generated image of the virtual object with respect to the degree of focus.

In accordance with an embodiment, the diagnostic system also comprises an image recording apparatus, with the image recording apparatus having a coupling device that is adapted to couple a light entry side of the image recording apparatus to a light exit side of the camera objective, with the image recording apparatus furthermore having an image sensor for generating electrical image signals on the basis of an image of the virtual object generated on the image sensor by the camera objective. The named evaluation device can be directly or indirectly connected or connectable to the image sensor. The coupling device can, for example, comprise a bayonet fastening, a screw connector or a clamp connector.

The named image recording apparatus can in particular be a video camera functional as a separate unit and having an object holder to which the light exit side of the camera objective is couplable. However, a dedicated unit having a calibrated flange focal length can also be provided.

The named evaluation device can be integrated into the image recording apparatus. The named image recording apparatus does not, however, necessarily have to be part of the diagnostic system. The image sensor of the respective camera to be tested can instead be used to generate electrical image signals in accordance with the image of the virtual object generated by the camera objective, said image signals being evaluated with respect to the degree of focus by the evaluation device. In this case, the evaluation device can in particular be connectable to the respective camera as a separate unit or as an electronic module integrated into the object simulation unit or the evaluation device can be integrated as a software module in the video camera (by a temporary or permanent storage of a program code in a memory of the video camera).

The analysis of the image of the virtual object can take place by electronic image analysis in the evaluation device. The evaluation device can in particular be adapted to determine a degree of focus of the image on the basis of the image signals of the named image sensor.

The determination of the degree of focus can in particular comprise a finding of whether or to which degree the virtual object is located in the focus of the camera objective. It can, however, also comprise a determination of the amount and/or of the sign of a defocus.

The evaluation device is advantageously adapted to determine the focal position of the image of the virtual object generated on the image sensor on the basis of a blur pattern. The analysis of the blur pattern can take place, for example, on the basis of structures in the image, e.g. of a point cloud generated by the virtual object, for example with respect to relative spacings and/or absolute positions of structural features.

The evaluation device can in particular determine the focal position on the basis of a parameter of the blur pattern (e.g. extent of a point cloud) and/or on the basis of an edge blur (or edge definition) of the blur pattern (e.g. of a single light spot).

If different light colors can be set at the light source of the object simulation unit, in accordance with an embodiment an analysis of the generated image of the virtual object or of a corresponding sensor image can take place such that chromatic aberration causes different focal positions for the virtual object.

If the object simulation unit generates a plurality of virtual objects at different lateral spacings from the optical axis, the analysis can take place in accordance with an embodiment such that image field curvature causes different focal positions for the virtual objects.

In accordance with an advantageous embodiment, the evaluation device is adapted to determine a maximum degree of focus of the generated image of the virtual object for different distance setting values set at the camera objective. This can in particular take place by an iterative setting of difference distance setting values and by determining a respective degree of focus of the image, with the different determined degrees of focus being evaluated (e.g. compared with one another) with respect to a maximum degree of focus. In this embodiment, the evaluation device is furthermore adapted to determine at least one correction value on the basis of a distance value of the virtual object that corresponds to a distance of the virtual object predefined by the object simulation unit (fixedly or adjustably) and on the basis of a distance setting value that is set at the camera objective and that corresponds to the determined maximum degree of focus of the image, said correction value representing a difference between the distance value of the virtual object and the distance setting value of the camera objective (with a maximum degree of focus). The setting of the distance setting value at the camera objective can take place manually or by an electric motor by means of a focusing mechanism, in particular by means of a focusing ring, with the distance setting value corresponding to a value of a distance scale of the objective permanently attached to the objective or of an electronically stored distance scale. The evaluation device can in particular determine the difference between the distance value of the virtual object set at the object simulation unit and the distance setting value set at the camera objective, with the correction value then being determined on the basis of this difference.

The distance setting value set at the camera objective and optionally further values such as a set diaphragm value (f-stop) and/or a set focal length can be transmitted to the evaluation device both electronically by the camera objective or the camera, for example with the aid of a so-called "lens data system", and manually by a user input of a setting value read off at the camera objective. An automation of the correction value determination is possible with an electronic transmission of the respective value.

In accordance with an advantageous embodiment, the evaluation device is adapted to determine a respective correction value for different distance values of the virtual object set at the object simulation unit (and respective corresponding distance setting values set at the camera objectives.

The evaluation device and/or an additional control device can in particular be adapted for an automatic setting of the distance at the object simulation unit and/or at the camera objective.

In accordance with a further advantageous embodiment, the correction value or values of the diagnostic system can be used to correct a difference of the flange focal length and/or of the camera from a nominal value. This can be done, for example, by placing a spacer compensating the difference into the objective mount at the camera side or at the objective side or by another displacement of the optical elements with respect to the sensor. The thickness of a spacer compensating the difference can in particular be determined on the basis of the at least one correction value.

The correction value(s) determined can furthermore be used to carry out a correction of a distance scale of the camera objective, with non-linear differences along the distance scale of the camera objective also being able to be taken into account.

The determined correction values can be stored in a non-volatile memory, for example in the form of a look-up table, and can be read out thereof. They can furthermore be used for generating a correction function on the basis of which an automatic correction of the focal position of the camera objective can in particular be carried out.

If the focal setting values are managed electronically in the objective-camera system, the correction value(s) or a corrected distance scale can be stored in the objective-camera system.

In accordance with a further advantageous embodiment, the evaluation device is couplable to a focal adjustment apparatus of an electrically adjustable camera objective, with the evaluation device being adapted to transmit a focal correction value to the focal adjustment apparatus on the basis of the correction value(s) determined. The focal correction value can in particular be stored in the focal adjustment apparatus.

In a further advantageous embodiment, the evaluation device is further adapted to determine the correction value(s) in dependence on a diaphragm value set at the camera objective and/or in dependence on a focal length set at the camera objective and/or in dependence on a total aperture of the at least one light beam generated by the light beam generation device and entering into the camera objective and/or in dependence on a color of the at least one light beam that passes through the light exit surface of the object simulation unit. Different correction values for different diaphragm values, different values for the focal length and/or different colors can be determined for this purpose with respect to the same distance value of the virtual object that corresponds to a distance of the virtual object predefined by the object simulation unit. A displacement of the ideal focal position that can be caused, for example, on a curvature of the focal plan caused by spherical aberration of the camera objective can hereby be taken into account in the diagnosis and in particular also in the correction of the camera objective.

Alternatively to the use of an evaluation device, the analysis of a sensor image of an image sensor of an image recording device connected to the respective camera objective can also take place visually, for example using the reproduction on a monitor.

To this extent, the named evaluation device is not a compulsory component of the diagnostic system and the present invention also relates to a diagnostic system having an object simulation unit in accordance with one of the above-explained embodiments and having an image recording apparatus, wherein the image recording apparatus has a coupling device that is adapted to couple a light entry side of the image recording apparatus to a light exit side of the respective camera objective, with the image recording apparatus furthermore having an image sensor for generating electric image signals on the basis of an image of the virtual object generated on the image sensor by the respective camera objective.

Further advantageous embodiments of the invention are named in the dependent claims, in the description and in the drawings.

Figure 2:
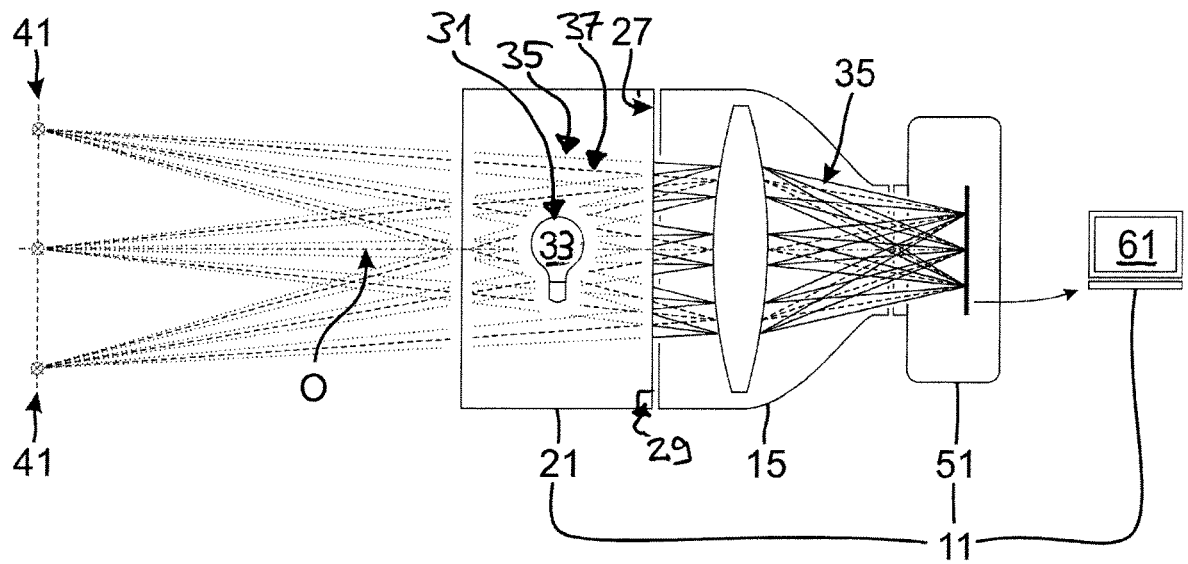
Figure 3:
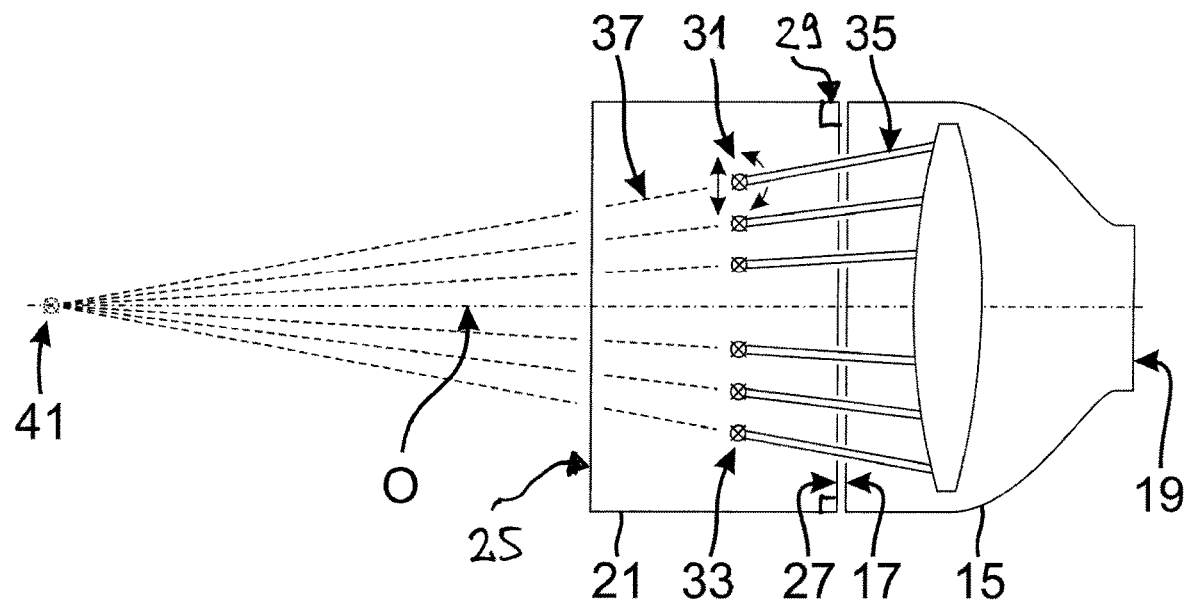
Figure 4:
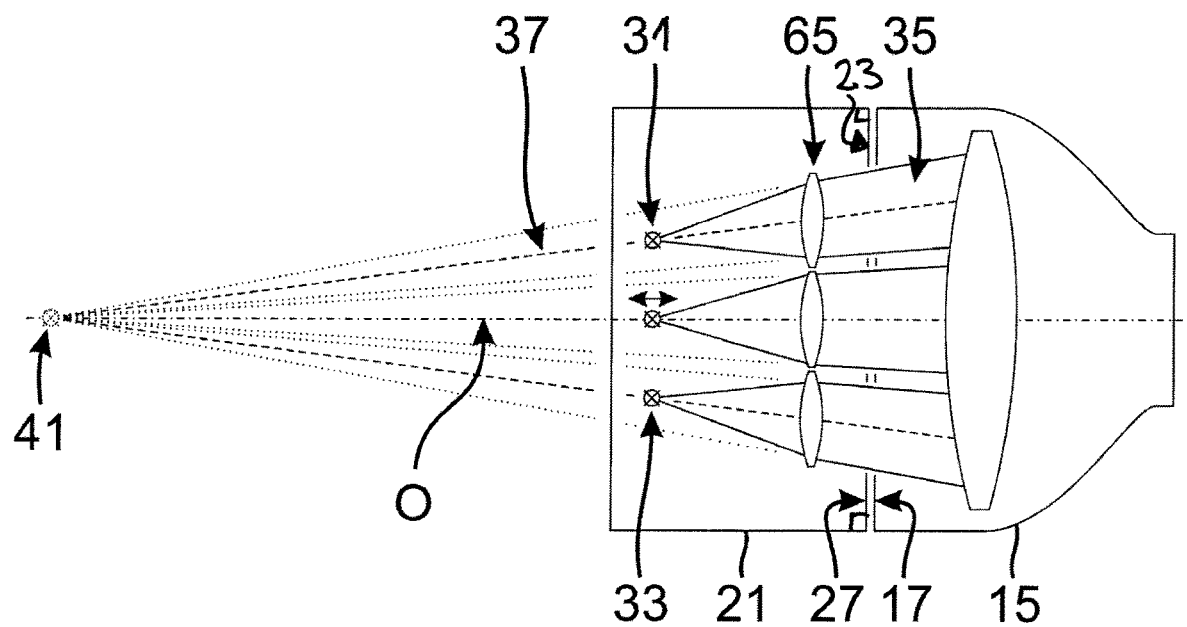
Figure 5:
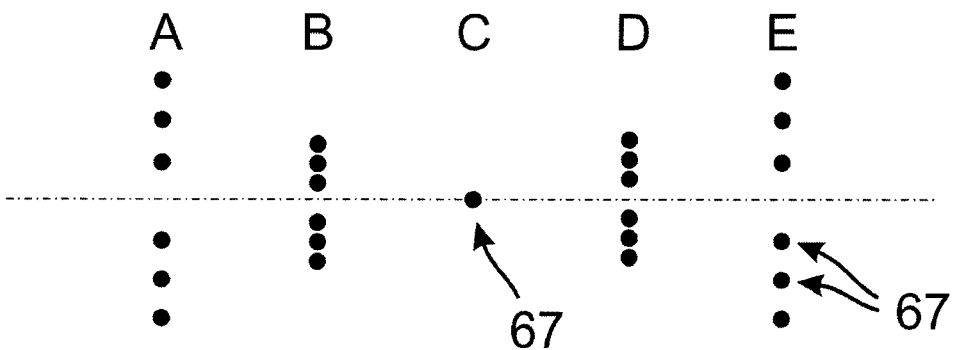
Figure 6:
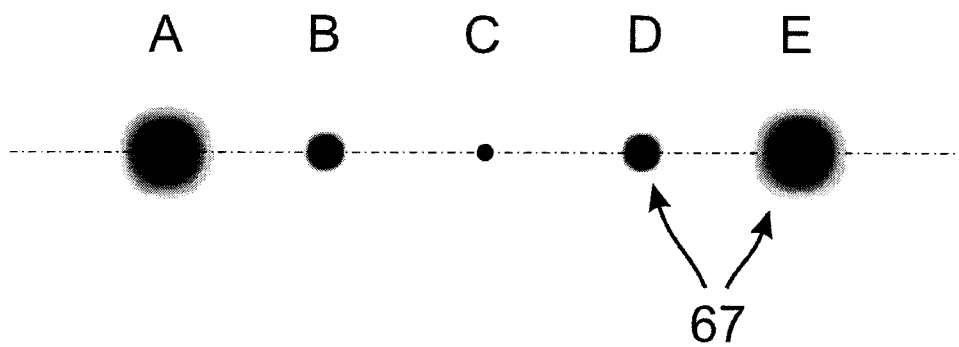

The invention will be explained in the following with reference to embodiments. There are shown:

FIG. 1 a schematic representation of a diagnostic system unit in accordance with a first embodiment with a single virtual object;

FIG. 2 a schematic representation of a diagnostic system unit in accordance with a second embodiment with a plurality of virtual objects;

FIG. 3 a schematic representation of an object simulation unit in accordance with an embodiment with a plurality of laser-like movable light sources that generate narrow light beams;

FIG. 4 a schematic representation of an object simulation unit in accordance with a further embodiment with a plurality of lenses for imaging a respective light source onto the virtual object;

FIG. 5 a plurality of images of a virtual object that are generated for different distance setting values in the form of a respective point cloud; and FIG. 6 a plurality of images of a virtual object that are generated for different distance setting values in the form of differently widened light spots.

FIG. 1 shows in a schematic representation the basic design of a diagnostic system 11 in accordance with a first embodiment having a single virtual object. The diagnostic system 11 serves for testing a camera objective 15 and comprises an object simulation unit 21. An image recording apparatus 51 is associated with the object simulation unit 21 and can be a part of the diagnostic system 11 and can be a specifically adapted unit. The image recording apparatus 51 can, however, also be formed by a video camera functional as a separate unit, in particular by a commercial video camera having an interchangeable objective mount. The diagnostic system 11 can also serve for the testing of a system of the camera objective 15 and of the camera, with the image recording apparatus 51 being formed by the camera to be tested in this case.

The object simulation unit 21 has a front side 23 and a rear side 25 with respect to an optical axis O. A light exit surface 27 and a coupling device 29 (shown schematically) are provided at the front side 23 of the object simulation unit 21 and the front side 23 of the object simulation unit 21 is coupled by means of them to a light entry side 17 of the camera objective. 15. The object simulation unit 21 furthermore has a light beam generation device 31 (shown symbolically by a light source 33) that generates at least one light beam 35. It can in this respect generally be a single (in particular divergent or conical) light beam 35 or the light beam generation device 31 generates a plurality of light beams 35 (that in particular merge into one another or are separate from one another) that pass through the light exit surface 21 in the direction of the light entry side 17 of the camera objective 15. The light beam 35 or the plurality of light beams 35 passes/pass through the light exit surface 27 of the object simulation unit 21 at a different lateral spacing from the optical axis O and along a respective light exit surface 37.

The light exit axes 37 are oriented such that the light beam or beams 35 appears/appear to start from the same point on the optical axis O—This point thus forms a virtual object 41 and the light exit axes 37 are arranged and oriented such that the light beam or beams 35 apparently starts/start from a single virtual object 41. The virtual object 41 is located at a distance from the light exit surface 27 of the object simulation unit 21 that is larger than the distance between the light beam generation device 31 and the light exit surface 27. The virtual object 41 is in this respect located outside the object simulation unit 21, namely at the other side of the rear side 25.

The light beam or beams 35 can be arranged distributed in the peripheral direction with respect to the optical axis O such that the light beam or beams 35 at least substantially passes/pass through the light exit surface 27 of the object simulation unit 21 at exit points that are at least substantially distributed over the total light exit surface 27. The light beams 35 can hereby at least substantially completely fill the entrance pupil at the light entry side 17 of the camera objective 15. It is, however, also possible alternatively to this—and is generally sufficient—that the exit points of the light beam or beams 35 only take up a part region of the light exit surface 27 of the object simulation unit 21. FIG. 1 is thus to be understood in this respect such that the lines drawn therein only represent a plurality of possible light paths that do not, however, all have to be illuminated by the light beam generation device 31.

The image recording apparatus 51 has a coupling device 53 (shown schematically) by means of which a light entry side 55 of the image recording apparatus 51 is coupled to a light exit side 19 of the camera objective 15. The image recording apparatus 51 furthermore has an image sensor 57. The image sensor 57 comprises a two-dimensional arrangement of light-sensitive reception elements and generates electric image signals on the basis of an image of the virtual object 41 generated on the image sensor 57 by the camera objective 15. An evaluation device 61 (shown symbolically) that can also be integrated into the image recording apparatus 51 is connected to the image sensor 57. The evaluation device 61 can determine a degree of focus of the image of the virtual object 41 on the basis of the image signals of the image sensor 57. This can in particular be done on the basis of a blur pattern of the image as will be explained in the following.

The image recording apparatus 51 can, as already mentioned be a video camera functional as a separate unit. If the image recording apparatus 51 is not a fixed component of the diagnostic system 11, but rather, for example, a commercial video camera, in particular a video camera to be tested, the diagnostic system 11 preferably comprises at least the evaluation device 61 that is e.g. connectable to the video camera as an electronic module or that can e.g. be integrated into the video camera as a software module (by temporary or permanent storage of a program code in a memory of the video camera).

The camera objective 15 has a focusing mechanism (not shown) provided with a distance scale. Different distance setting values can be set by means of the focusing mechanism to adapt an image definition of the image generated by means of the camera objective 15.

A correction value can be determined by means of the evaluation device 61 that represents a difference between the distance of the virtual object 41 from the image sensor 57, on the one hand, and the distance set at the camera objective 15 in accordance with the distance scale, on the other hand. The distance value of the virtual object 41 can be known with great accuracy by a prior calibration of the object simulation unit 21 or of the system comprising the object simulation unit 21 and the image recording apparatus 51. The determined correction value can thus serve to correct a normal flange focal length (determined, for example, on the manufacture of the camera objective 15). The determined correction value can in particular serve to carry out a correction of the distance scale of the camera objective 15.

The determination of the correction value by means of the evaluation device 61 can, for example, take place in that a maximum degree of focus of the image of the virtual object 41 generated on the image sensor 57 is determined for different distance setting values set at the camera objective 15. For which distance setting value set at the camera objective 15 the highest image definition is achieved can be determined by a mutual comparison of the determined degrees of focus. The corresponding distance value of the virtual object 41 is exactly known for this distance setting value due to the object simulation unit 21. The sought correction value can then be determined (for example on the basis of a difference formation) from a difference between these two distance values.

An advantage of the object simulation unit 21 comprises the virtual object 41 being able to be located outside the object simulation unit 21. The object simulation unit 21 can thus be used also to check relatively large distance setting values of the camera objective 15 for their accuracy. The object simulation unit 21 can nevertheless have a very compact construction along the optical axis O.

It must also still be noted with respect to FIG. 1 that the light beam generation device 31 can also be adjustable such that the virtual object 41 is generated consecutively in time at different points along the optical axis O. The camera objective 15 or the system of camera objective 15 and image recording apparatus 51 or video camera can hereby be checked over a range of a plurality of distance setting values and different correction values can be determined for different distance setting values of the camera objective 15.

The embodiment shown in FIG. 2 illustrates with respect to FIG. 1 that a plurality of virtual objects 41 can also be generated by means of the light beam generation device 31 and are arranged within the same orthogonal plane with respect to the optical axis O at a different lateral spacing from the optical axis O, that is at different image heights. For this purpose, the light exit axes 37 of the light beams 35 can be differently oriented at the light exit surface 27 of the object simulation unit 21 in accordance with the different virtual objects 41. The plurality of virtual objects 41 can in particular be simultaneously generated.

The light beam generation device 31 of the object simulation unit 21 can have a single light source 33 in accordance with an exemplary embodiment. A plurality of separate light beams 35 can nevertheless be generated, for example in that the light beam generation device 31 comprises a diaphragm apparatus (not shown) that has a plurality of diaphragm apertures to transmit respective portions of the light emitted by the light source 33 and to form individual light beams 35.

Two possible embodiments for a light beam generation device 31 of the object simulation unit 21 that has a plurality of light sources 33 will be explained in the following with reference to FIGS. 3 and 4.

In accordance with FIG. 3, the light beam generation device 31 comprises a plurality of light sources 33 (e.g. light-emitting diodes or laser diodes) of which each emits a narrow light beam 35 along a light exit axis 37. The respective light beam 35 can be parallel or can substantially comprise a single light ray. A respective optical imaging element (not shown in FIG. 3) can be associated with the light sources 33. The light sources 33 are arranged within the same orthogonal plane with respect to the optical axis O and are arranged at different lateral spacings from the optical axis O.

As is indicated in FIG. 3 for the topmost light source 33 by a respective double arrow, the respective spacing of the light sources 33 from the optical axis O and the respective orientation of the light sources 33 or of the emitted light beams 35 can be adjusted. The distance between the virtual object 41 and the light exit surface 27 of the object simulation unit 21 can hereby be changed. The exit angle of the respective light beam 35 at which the light beam 35 passes through the light exit surface 27 of the object simulation unit 21 can in particular be varied simply by adjusting the respective orientation of the light sources 33. An associated imaging element can be adjusted together with the respective light source 33. An electric controllable drive device (not shown) can be provided for the adjustment of the respective light source 33.

In accordance with FIG. 4, the light beam generation device 31 comprises a plurality of light sources 33 (e.g. light-emitting diodes or laser diodes) of which each emits a divergent light beam 35 along a light exit axis 37. The light beam generation device 31 comprises a plurality of optical imaging elements 65 in the form of lenses, with a respective imaging element 65 being associated with each light source 33. FIG. 4 thus illustrates the respective imaging of a plurality of light sources 33 on a virtual object 41 by optical elements 65, with a plurality of light sources 33 being imaged onto the same virtual object 41.

As is indicated for the topmost light source 33 by a double arrow in FIG. 4, the position of the respective light source 33 can be adjusted relative to the respective imaging element 65 to change the distance between the virtual object 41 and the light exit surface 27 of the object simulation unit 21. The adjustability of the position of the respective light source 33 can take place along the optical axis O, for example.

Finally, as regards the evaluation of the image of the respective virtual object 41 generated on the image sensor 57, the degree of focus depends on the combined flange focal length of the camera objective 15 and the image recording apparatus 51, on the distance value of the virtual object 41, and on the distance setting value of the camera objective 15.

For example, individual images of the virtual object are generated at the image sensor 57 at different heights above the optical axis that merge at least substantially to a single image on a correct setting of the distance setting value and the flange focal length. Such different images of the virtual object for different distance setting values of the camera objective 15 are shown by way of example in FIG. 5 (different distance setting values shown from left to right). FIG. 5 illustrates the determination of the degree of focus with reference to the value of a point cloud (a plurality of mutually distinguishable light spots 67) generated on the light-sensitive surface of the image sensor 57 for different distance setting values A, B, C, D, and E of the camera objective 15. The virtual object 41 for this purpose has to correspond at least approximately to a point light source so that the light beams 35 (apparently) starting from the virtual object 41 generate the individual (almost point-shaped) light spots 67 in accordance with FIG. 5. At a small degree of focus, the individual light beams 35 or the light spots 67 generated thereby on the image sensor 57 can be distinguished from one another. It can be seen that the distance setting value C of the camera objective 15, for which the middle image is generated corresponds to a maximum degree of focus.

The evaluation device 61 can also determine the degree of focus of the image of the respective virtual object 41 on the image sensor 57 on the basis of a blur pattern of a single light spot 67. FIG. 6 illustrates the determination of the degree of focus with reference to the edge definition of such a light spot 67 generated on the light-sensitive surface of the image sensor 57. The virtual object 41 in this respect has to have a small areal extent. FIG. 6 shows a comparison of the respective image of a virtual object 41 for different distance setting values A, B, C, D, and E of the camera objective 15 (again shown from left to right). The images appear as a respective light spot 67. The distance setting value C for which the middle image is generated, corresponds to a maximum edge definition of the blur pattern formed by the image and thus to a maximum degree of focus.

REFERENCE NUMERAL LIST 11 diagnostic system
15 camera objective
17 light entry side of the camera objective
19 light exit side of the camera objective
21 object simulation unit
23 front side of the object simulation unit
25 rear side of the object simulation unit
27 light exit surface of the object simulation unit
29 coupling device of the object simulation unit
31 light beam generation device
33 light source
35 light beam
37 light exit axis
41 virtual object
51 image recording apparatus
53 coupling device of the image recording apparatus
55 light entry side of the image recording apparatus
57 image sensor
61 evaluation device
65 imaging element
67 light spot
O optical axis

The invention claimed is:

1. An object simulation unit for testing a camera objective, wherein the object simulation unit has an optical axis and a front side with respect to the optical axis at one end, comprising:
   a light exit surface at the front side of the object simulation unit;
   a coupling device that is adapted to couple the front side of the object simulation unit to a light entry side of a respective camera objective so that the object simulation unit is positioned in front of the camera objective; and
   a light beam generation device that has at least one light source and that is adapted to generate at least one light beam that passes through the light exit surface such that the at least one light beam apparently starts from at least one virtual object that is located at a distance from the light exit surface that is larger than the distance between the light beam generation device and the light exit surface, wherein:
   a) the light beam generation device has a plurality of light sources, and
   b) at least one of the position and the orientation of the plurality of light sources is adjustable such that the distance between the virtual object and the light exit surface of the object simulation unit is variable by an adjustment of the plurality of light sources.

2. An object simulation unit in accordance with claim 1, wherein the at least one virtual object is disposed outside the object simulation unit.

3. An object simulation unit in accordance with claim 1, wherein the virtual object at least substantially corresponds to a virtual point light source.

4. An object simulation unit in accordance with claim 1, wherein the virtual object corresponds to a linear virtual light source that extends within an orthogonal plane with respect to the optical axis.

5. An object simulation unit in accordance with claim 1, wherein the virtual object corresponds to a two-dimensional virtual light source that extends within an orthogonal plane with respect to the optical axis.

6. An object simulation unit in accordance with claim 1, wherein the light beam generation device is adapted to generate a respective virtual object on the optical axis consecutively after one another at different distances from the light exit axis of the object simulation unit.

7. An object simulation unit in accordance with claim 1, wherein the light beam generation device is adapted to simultaneously generate a plurality of virtual objects within an orthogonal plane with respect to the optical axis.

8. An object simulation unit in accordance with claim 1, wherein the light beam generation device is adapted to simultaneously generate a plurality of virtual objects at different lateral spacings from the optical axis.

9. An object simulation unit in accordance with claim 1, wherein at least one of the distance between the at least one virtual object and the light exit surface of the object simulation unit and the lateral spacing of the at least one virtual object from the optical axis of the object simulation unit is settable.

10. An object simulation unit in accordance with claim 1, wherein the at least one light beam passes through the light exit surface of the object simulation unit along a light exit axis that is inclined by an exit angle with respect to the optical axis of the object simulation unit, with the exit angle being settable.

11. An object simulation unit in accordance with claim 1, wherein the light beam generation device is adapted to generate light beams that pass through the light exit surface.

12. An object simulation unit in accordance with claim 11, wherein the plurality of light beams pass through the light exit surface of the object simulation unit along a respective light exit axis, with the light exit axes being oriented such that the plurality of light beams appear to start from the at least one virtual object.

13. An object simulation unit in accordance with claim 11, wherein at least some of the plurality of light beams are arranged distributed in the peripheral direction with respect to the optical axis.

14. An object simulation unit in accordance with claim 11, wherein at least some of the plurality of light beams pass through the light exit surface at different spacings from the optical axis.

15. An object simulation unit in accordance with claim 11, wherein the plurality of light beams are separate from one another.

16. An object simulation unit in accordance with claim 11, wherein the light beam generation device is adapted to generate the plurality of light beams such that the plurality of light beams pass through the light exit surface of the object simulation unit at exit positions that are spaced apart from one another in order only to partly fill an entrance pupil of the respective camera objective.

17. An object simulation unit in accordance with claim 11, wherein the light beam generation device is adapted to generate the plurality of light beams such that the plurality of light beams pass through the light exit surface of the object simulation unit at exit positions that are at least substantially distributed over the total light exit surface to at least substantially fill an entrance pupil of the respective camera objective.

18. An object simulation unit in accordance with claim 1, wherein the light beam generation device has at least one imaging element that is associated with the at least one light source.

19. An object simulation unit in accordance with claim 1, wherein the light beam generation device is adapted to generate a plurality of light beams that pass through the light exit surface of the object simulation unit, with each of the plurality of light sources generating at least one of the plurality of light beams and/or a single one of the plurality of light beams.

20. An object simulation unit in accordance with claim 1, wherein the plurality of light sources are arranged within the same orthogonal plane with respect to the optical axis.

21. An object simulation unit in accordance with claim 1, wherein at least some of the plurality of light sources are arranged distributed in the peripheral direction with respect to the optical axis.

22. An object simulation unit in accordance with claim 1, wherein at least some of the plurality of light sources are arranged at different spacings from the optical axis.

23. An object simulation unit in accordance with claim 1, wherein the light beam generation device furthermore has a plurality of imaging elements, with at least one of the plurality of imaging elements being associated with each of the plurality of light sources.

24. An object simulation unit in accordance with claim 23, wherein at least one of the position and the orientation of the plurality of imaging elements is adjustable such that the distance between the virtual object and the light exit surface of the object simulation unit is variable by an adjustment of the plurality of imaging elements.

25. An object simulation unit in accordance with claim 1, wherein the light beam generation device comprises at least one diaphragm apparatus, with the diaphragm apparatus having at least one diaphragm aperture that is variable with respect to at least one of an opening width and a position and that transmits portions of the light emitted by the at least one light source.

26. An object simulation unit in accordance with claim 1, wherein the at least one light source emits white light.

27. An object simulation unit in accordance with claim 1, wherein the light beam generation device (31 is adapted to generate the at least one light beam with one of a plurality of different selectable colors.

28. A diagnostic system having an object simulation unit in accordance with claim 1, having an evaluation device that is adapted to determine a degree of focus of an image of the at least one virtual object, which image is generated by the respective camera objective coupled to the object simulation unit.

29. A diagnostic system in accordance with claim 28, wherein the diagnostic system furthermore comprises an image recording apparatus, with the image recording apparatus having a coupling device that is adapted to couple a light entry side of the image recording apparatus to a light exit side of the respective camera objective, and with the image recording apparatus having an image sensor for generating electric image signals on the basis of an image of the virtual object generated on the image sensor by the respective camera objective, with the evaluation device being directly or indirectly connected or connectable to the image sensor.

30. A diagnostic system in accordance with claim 29, wherein the image recording apparatus is a video camera having an objective mount to which the light exit side of the camera objective is couplable.

31. A diagnostic system in accordance with claim 28, wherein the evaluation device is adapted to determine the degree of the image of the virtual object on the basis of a blur pattern.

32. A diagnostic system in accordance with claim 31, wherein the evaluation device is adapted to determine the degree of focus on the basis of at least one of a parameter of the blur pattern and an edge blur of the blur pattern.

33. A diagnostic system in accordance with claim 31, wherein the image of the at least one virtual object comprises one or more light spots.

34. A diagnostic system in accordance with claim 28, wherein the evaluation device is adapted to determine a maximum degree of focus of the image of the virtual object for different distance setting values set at the camera objective; and
wherein the evaluation device is furthermore adapted to determine at least one correction value on the basis of a distance value of the virtual object that corresponds to a distance of the virtual object predefined by the object simulation unit and on the basis of a distance setting value that is set at the camera objective and that corresponds to the determined maximum degree of focus of the image, said correction value representing a difference between the distance value of the virtual object and the distance setting value of the camera objective.

35. A diagnostic system in accordance with claim 34, wherein the evaluation device is adapted to determine a respective correction value for different distance values of the virtual object set at the object simulation unit.

36. A diagnostic system in accordance with claim 34, wherein the evaluation device is adapted to determine the thickness of a spacer compensating the difference on the basis of the determined correction value, said spacer being provided for insertion between the respective camera objective and a camera, between the respective camera objective and an objective mount connectable to a camera, or between an objective mount connectable to the camera and the camera.

37. A diagnostic system in accordance with claim 34, wherein the evaluation device is couplable to a focal adjustment apparatus of an electrically adjustable camera objective; and
wherein the evaluation device is adapted to transmit a focal correction value determined on the basis of the determined correction value or values to the focal adjustment apparatus.

38. A diagnostic system in accordance with claim 34, wherein the evaluation device is adapted to determine the correction value or values in dependence on at least one of
a diaphragm value set at the camera objective;
a focal length of the camera objective;
a total aperture of the at least one light beam generated by the light beam generation device and entering into the camera objective; and
a color of the at least one light beam.

39. An object simulation unit for testing a camera objective,
wherein the object simulation unit has an optical axis and a front side with respect to the optical axis at one end, comprising:

a light exit surface at the front side of the object simulation unit;

a coupling device that is adapted to couple the front side of the object simulation unit to a light entry side of a respective camera objective so that the object simulation unit is positioned in front of the camera objective; and a light beam generation device that has at least one light source and that is adapted to generate at least one light beam that passes through the light exit surface such that the at least one light beam apparently starts from at least one virtual object that is located at a distance from the light exit surface that is larger than the distance between the light beam generation device and the light exit surface, wherein:

a) the light beam generation device has a plurality of light sources;

b) the light beam generation device furthermore has a plurality of imaging elements, with at least one of the plurality of imaging elements being associated with each of the plurality of light sources; and c) at least one of the position and the orientation of the plurality of imaging elements is adjustable such that the distance between the virtual object and the light exit surface of the object simulation unit is variable by an adjustment of the plurality of imaging elements.

40. A diagnostic system having an object simulation unit in accordance with claim 39, having an evaluation device that is adapted to determine a degree of focus of an image of the at least one virtual object, which image is generated by the respective camera objective coupled to the object simulation unit.

41. A diagnostic system in accordance with claim 40, wherein the diagnostic system furthermore comprises an image recording apparatus, with the image recording apparatus having a coupling device that is adapted to couple a light entry side of the image recording apparatus to a light exit side of the respective camera objective, and with the image recording apparatus having an image sensor for generating electric image signals on the basis of an image of the virtual object generated on the image sensor by the respective camera objective, with the evaluation device being directly or indirectly connected or connectable to the image sensor.

42. A diagnostic system in accordance with claim 41, wherein the image recording apparatus is a video camera having an objective mount to which the light exit side of the camera objective is couplable.

43. An object simulation unit in accordance with claim 39, wherein each of the plurality of imaging elements comprises at least one of a refractive, reflective or diffractive optical imaging element.

* * * * *